(12) United States Patent
Yang et al.

(10) Patent No.: US 11,081,144 B1
(45) Date of Patent: Aug. 3, 2021

(54) TOOL-FREE HARD DISK MOUNTING AND DISMOUNTING DEVICE

(71) Applicant: ZHENGZHOU YUNHAI INFORMATION TECHNOLOGY CO., LTD., Henan (CN)

(72) Inventors: Xiaodong Yang, Henan (CN); Shuo Zhang, Henan (CN)

(73) Assignee: ZHENGZHOU YUNHAI INFORMATION TECHNOLOGY CO., LTD., Henan (CN)

( * ) Notice: Subject to any disclaimer, the term of this patent is extended or adjusted under 35 U.S.C. 154(b) by 512 days.

(21) Appl. No.: 16/097,074

(22) PCT Filed: Sep. 14, 2017

(86) PCT No.: PCT/CN2017/101721
§ 371 (c)(1),
(2) Date: Oct. 26, 2018

(87) PCT Pub. No.: WO2018/196258
PCT Pub. Date: Nov. 1, 2018

(30) Foreign Application Priority Data

Apr. 25, 2017 (CN) .......................... 201710277908.0

(51) Int. Cl.
*H05K 5/02* (2006.01)
*G11B 33/02* (2006.01)

(52) U.S. Cl.
CPC ........... *G11B 33/022* (2013.01); *H05K 5/023* (2013.01); *H05K 5/0204* (2013.01)

(58) Field of Classification Search
CPC ...... H05K 5/0204; H05K 5/023; G06F 1/181; G06F 1/18; G11B 33/022
See application file for complete search history.

(56) References Cited

U.S. PATENT DOCUMENTS

| 5,694,290 A * | 12/1997 | Chang ................. G11B 33/025 |
| | | 361/679.31 |
| 6,249,432 B1 * | 6/2001 | Gamble ................. G06F 1/184 |
| | | 248/618 |

(Continued)

FOREIGN PATENT DOCUMENTS

| CN | 102109893 A | 6/2011 |
| CN | 102809995 A | 12/2012 |

(Continued)

OTHER PUBLICATIONS

International Search Report and Written Opinion from International Application No. PCT/CN2017/101721, dated Dec. 27, 2017.

*Primary Examiner* — Abhishek M Rathod
*Assistant Examiner* — Keith DePew
(74) *Attorney, Agent, or Firm* — Yue (Robert) Xu; Apex Attorneys at Law, LLP

(57) ABSTRACT

A tool-free hard disk mounting and dismounting device is provided according to the present application. The tool-free hard disk mounting and dismounting device includes a fixing support, a spring strip and a handle, wherein the fixing support includes a base plate, a first vertical plate and a second vertical plate, the first vertical plate and the second vertical plate are fixed to two sides of the base plate respectively, and fixing convex portions are provided at two sides of the first vertical plate respectively. The spring strip is fixed to the second vertical plate and located at an outer side of the second vertical plate, a bent portion is provided at each of two ends of the spring strip, a fixing column is provided at each of the bent portions, and a spring strip oblique boss is provided at each of two sides of the spring strip.

12 Claims, 2 Drawing Sheets

(56) References Cited

U.S. PATENT DOCUMENTS

| | | | | |
|---|---|---|---|---|
| 6,467,858 B1* | 10/2002 | Le | ............................ | G06F 1/181 |
| | | | | 312/223.2 |
| 7,006,351 B2* | 2/2006 | Chen | ........................ | G06F 1/184 |
| | | | | 248/222.11 |
| 7,542,280 B2* | 6/2009 | Hong | ..................... | G11B 33/12 |
| | | | | 361/679.33 |
| 7,639,490 B2* | 12/2009 | Qin | .......................... | G06F 1/187 |
| | | | | 361/679.34 |
| 8,094,446 B2* | 1/2012 | Liu | ....................... | G11B 33/124 |
| | | | | 361/679.33 |
| 8,434,726 B2* | 5/2013 | Chen | ........................ | G06F 1/187 |
| | | | | 248/220.21 |
| 8,582,287 B2* | 11/2013 | Nguyen | ................... | G06F 1/187 |
| | | | | 361/679.37 |
| 9,064,511 B1* | 6/2015 | Yang | ..................... | G11B 33/128 |
| 9,734,873 B1* | 8/2017 | Chien | ................... | G11B 33/022 |
| 2003/0112596 A1* | 6/2003 | Shih | ......................... | G06F 1/187 |
| | | | | 361/679.33 |
| 2005/0038926 A1* | 2/2005 | Chang | ................... | G11B 33/022 |
| | | | | 710/8 |
| 2006/0028805 A1* | 2/2006 | Hidaka | ................. | G11B 33/126 |
| | | | | 361/754 |
| 2008/0007908 A1 | 1/2008 | Chen | | |
| 2008/0157638 A1* | 7/2008 | Liu | .......................... | G06F 1/187 |
| | | | | 312/223.2 |
| 2008/0158810 A1* | 7/2008 | Liu | ....................... | G11B 33/124 |
| | | | | 361/679.33 |
| 2008/0259554 A1* | 10/2008 | Qin | .......................... | G06F 1/187 |
| | | | | 361/679.34 |
| 2009/0146030 A1* | 6/2009 | Chen | ....................... | G06F 1/187 |
| | | | | 248/213.2 |
| 2011/0075347 A1* | 3/2011 | Liu | ....................... | G11B 33/124 |
| | | | | 361/679.33 |
| 2012/0305720 A1 | 12/2012 | Chen et al. | | |
| 2015/0043151 A1* | 2/2015 | Cravens | ................ | H05K 7/1487 |
| | | | | 361/679.37 |
| 2018/0197579 A1* | 7/2018 | Chen | ........................ | H05K 7/14 |
| 2019/0333544 A1* | 10/2019 | Yang | .................... | G11B 33/0461 |

FOREIGN PATENT DOCUMENTS

| | | |
|---|---|---|
| CN | 205485840 U | 8/2016 |
| CN | 107092318 A | 8/2017 |

* cited by examiner

TOOL-FREE HARD DISK MOUNTING AND DISMOUNTING DEVICE

The present application is the national phase of International Application No. PCT/CN2017/101721, titled "TOOL-FREE HARD DISK MOUNTING AND DISMOUNTING DEVICE", filed on Sep. 14, 2017, which claims the priority to Chinese Patent Application No. 201710277908.0 titled "TOOL-FREE HARD DISK MOUNTING AND DISMOUNTING DEVICE", filed on Apr. 25, 2017 with the State Intellectual Property Office of the People's Republic of China, the entire disclosures of which applications are incorporated herein by reference.

FIELD

The present application relates to the field of computer technology, and in particular provides a tool-free hard disk mounting and dismounting device.

BACKGROUND

Computers have advantages of large amount of stored information, convenient and quick information access by users, and are widely used. Especially, with the further development of society and economy, the era of big data is coming, and the demand for data traffic is increasingly great in industries of internet, communications and the like. A hard disk is one of the main storage media of a computer. Hard disks are classified into SSD hard disks, mechanical hard disks, and hybrid hard disks. With the increasing demand for data traffic, the requirements imposed on storage devices in computers are becoming higher and higher, and the storage devices are required to have higher storage densities. In order to increase the storage density of the computer, trays specially for placing hard disks have already existed, and there are also various corresponding hard disk fixing structures. Although the currently existing hard disk fixing structure can fix the hard disk without screws, the operation of mounting and dismounting the hard disk is cumbersome, which reduces the work efficiency.

SUMMARY

In view of the above issue, the technical task of the present application is to provide a tool-free hard disk mounting and dismounting device that is simple and reasonable in structural design, simple in operation, and can realize mounting and dismounting of a hard disk simply by sliding the handle, thereby greatly improving the work efficiency.

In order to achieve the above object, the following technical solution is provided according to the present application.

A tool-free hard disk mounting and dismounting device includes a fixing support, a spring strip and a handle. The fixing support includes a base plate, a first vertical plate and a second vertical plate, the first vertical plate and the second vertical plate are fixed to two sides of the base plate respectively, and fixing convex portions are provided at two sides of the first vertical plate respectively. The spring strip is fixed to the second vertical plate and located at an outer side of the second vertical plate, a bent portion is provided at each of two ends of the spring strip, a fixing column is provided at each of the bent portions, and a spring strip oblique boss is provided at each of two sides of the spring strip. The handle is arranged at an inner side of the second vertical plate, a slide slot is provided at each of two sides of the handle, and the handle is in slide fit with the second vertical plate through the slide slots, the handle is provided with a handle oblique boss at each of two ends thereof, and the handle oblique bosses cooperate with the spring strip oblique bosses. A first connection structure is provided at a middle position of the spring strip, a second connection structure is provided at a middle position of the handle, and the spring strip cooperates with the handle through the first connection structure and the second connection structure.

A flat head screw is provided in each of the slide slots of the handle, and the flat head screw is threadedly connected to the second vertical plate. When the handle is required to be fixed, the flat head screws are tightened; when the handle is required to be moved along the slide slots, the flat head screws are loosened; and when the handle reaches a specified position, the flat head screws are tightened to fix the handle.

During the process of using the tool-free hard disk mounting and dismounting device according to the present application, when a hard disk is being fixed, screw holes at one side of the hard disk are matched with the fixing convex portions at the two sides of the first vertical plate, and the fixing convex portions are engaged in the screw holes at the one side of the hard disk. The bent portions at the two ends of the spring strip fit against another side of the hard disk, and the fixing columns are engaged into fixing holes at the another side of the hard disk respectively, to fix the hard disk on the fixing support. When the hard disk is being dismounted, the flat head screws are loosened and then the handle is moved along the slide slots. Meanwhile, the height of a contact portion between each of the spring strip oblique bosses and the corresponding handle oblique boss is gradually increased, such that the left and right sides of the spring strip are lifted, and the two ends of the spring strip are lifted up by a fixed height, such that the fixing columns are disengaged from the fixing holes on the another side of the hard disk, thus achieving the unlocking of the hard disk, and the hard disk is easily dismounted.

Preferably, the base plate is provided with supporting bosses at four opposite corners thereof respectively. The supporting bosses are configured to support the hard disk after the hard disk is fixed to the fixing support, which can prevent the PCB (Printed Circuit Board) at the bottom of the hard disk from coming into direct contact with the fixing support, thereby effectively protecting the hard disk.

Preferably, a hollowed out portion is formed at the bottom of the base plate, which facilitates the dissipation of heat generated by the hard disk during operation, and thus can protect the hard disk from being damaged and prolong the service life of the hard disk.

Preferably, the first connection structure is a plurality of position-limiting holes, and the second connection structure is a position-limiting convex portion.

When the hard disk is being dismounted, the flat head screws are loosened and then the handle is moved along the slide slots. Meanwhile, the height of the contact portion between each of the spring strip oblique bosses and the corresponding handle oblique boss is gradually increased, such that the left and right sides of the spring strip are lifted. When the position-limiting convex portion slides from a position-limiting hole into another position-limiting hole in the middle of the spring strip, the two ends of the spring strip are lifted up by the fixed height, such that the fixing columns are disengaged from the fixing holes at the another side of the hard disk, thus achieving the unlocking of the hard disk, and the hard disk is easily dismounted.

Preferably, the first vertical plate and the second vertical plate are fixed at edges of the two side of the base plate respectively.

Preferably, the first vertical plate and the second vertical plate are detachably fixed to the base plate. The positional relationship between the first vertical plate and the second vertical plate may be adjusted according to practical requirements, so as to be adapted to the mounting and dismounting of non-standard hard disks.

Preferably, the first vertical plate is in parallel with the second vertical plate.

Compared with the conventional technology, the tool-free hard disk mounting and dismounting device according to the present application has the following outstanding beneficial effects:

1. the first vertical plate is provided with the fixing convex portion at each of the two sides thereof, and each of the bent portions of the spring strip is provided with the fixing column. Thus, in the process of fixing the hard disk, the fixing convex portions and the fixing columns are engaged in screw holes and fixing holes at the two sides of the hard disk respectively, thereby enhancing the firmness of the fixation of the hard disk;

2. the bottom of the base plate is provided with the hollowed out portion, which facilitates the dissipation of heat generated by the hard disk during operation, and thus can protect the hard disk from being damaged and prolong the service life of the hard disk. The base plate is provided with supporting bosses, configured for supporting the hard disk, at four opposite corners thereof respectively, which can prevent the PCB at the bottom of the hard disk from coming into direct contact with the fixing support, thereby effectively protecting the hard disk; and 3. the plurality of position-limiting holes are provided at the middle position of the spring strip, and the handle is provided with the position-limiting convex portion corresponding to the position-limiting holes. The spring strip is provided with the spring strip oblique bosses at the two sides thereof respectively, and the two ends of the handle are each provided with a handle oblique boss at the position corresponding to the respective spring strip oblique boss, and the handle is provided with the slide slots. When the hard disk is being dismounted, the handle is moved along the slide slots, the height of the contact portion between each of the spring strip oblique bosses and the corresponding handle oblique boss is gradually increased, such that the left and right sides of the spring strip are lifted. When the position-limiting convex portion slides from the position-limiting hole into another position-limiting hole in the middle of the spring strip, the two ends of the spring strip are lifted up by the fixed height, such that the fixing columns are disengaged from the fixing holes at the another side of the hard disk, thus achieving the unlocking of the hard disk, and the hard disk may be easily dismounted.

Figure 1:
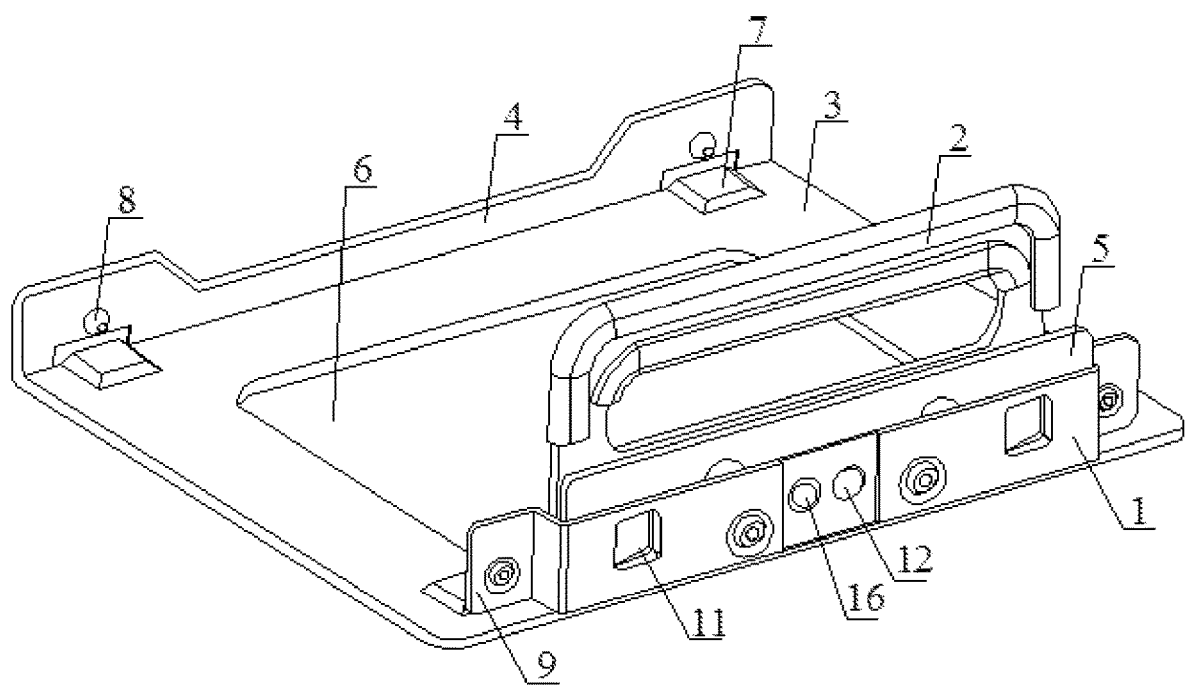
FIG. 1 is a schematic view showing the structure of a tool-free hard disk mounting and dismounting device according to the present application.
Figure 2:
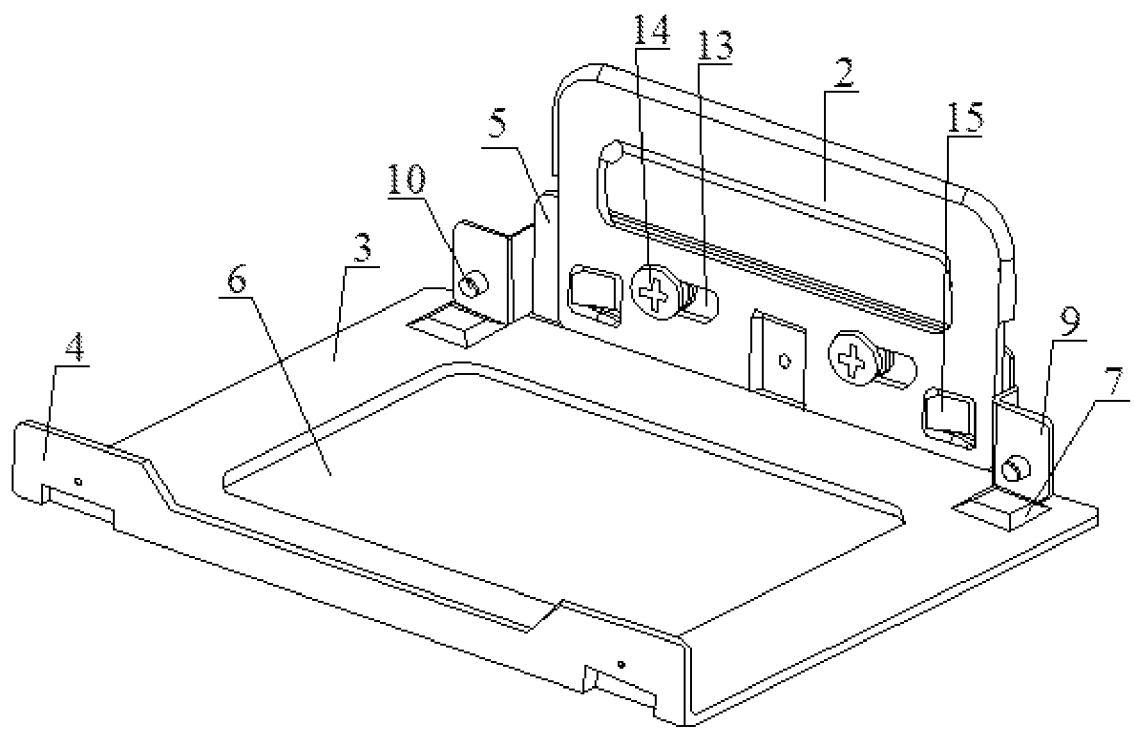
FIG. 2 is a schematic view showing another structure of the tool-free hard disk mounting and dismounting device according to the present application.

Reference numerals in FIGS. 1 and 2:
1 spring strip,
2 handle,
3 base plate,
4 first vertical plate,
5 second vertical plate,
6 hollowed out portion,
7 supporting boss,
8 fixing convex portion,
9 bent portion,
10 fixing column,
11 spring strip oblique boss,
12 position-limiting hole,
13 slide slot,
14 flat head screw,
15 handle oblique boss,
16 position-limiting convex portion.

DETAILED DESCRIPTION

The tool-free hard disk mounting and dismounting device according to the present application is further described in detail below with reference to the drawings and embodiment.

Embodiment

As shown in FIGS. 1 and 2, the tool-free hard disk mounting and dismounting device according to the present application includes a fixing support, a spring strip 1 and a handle 2. The fixing support includes a base plate 3, a first vertical plate 4 and a second vertical plate 5. A hollowed out portion 6 is formed at the bottom of the base plate 3, and supporting bosses 7 are fixed at positions of four opposite corners of the base plate 3 respectively. The first vertical plate 4 and the second vertical plate 5 are fixed at edges of two sides of the base plate 3 respectively, and the first vertical plate 4 is in parallel with the second vertical plate 5. The four supporting bosses 7 are respectively located on the base plate 3 at positions near the first vertical plate 4 and the second vertical plate 5. A fixing convex portion 8 is fixed at each of two sides of the first vertical plate 4.

The spring strip 1 is fixed onto the second vertical plate 5 and is located at an outer side of the second vertical plate 5. The spring strip 1 is provided with a bent portion 9 at each of two ends thereof, and a fixing column 10 is fixed to each of the bent portions 9. A spring strip oblique boss 11 is provided at each of two sides of the spring strip 1, and two position-limiting holes 12 are provided at a middle position of the spring strip 1.

The handle 2 is arranged at an inner side of the second vertical plate 5, the handle 2 is provided with a slide slot 13 at each of two sides thereof, a flat head screw 14 is arranged in each of the slide slots 13, and the flat head screw 14 is threadedly connected to the second vertical plate 5. The handle 2 is able to slide along the slide slots 13 and is in slide fit with the second vertical plate 5. The handle 2 is provided with a handle oblique boss 15 at each of two ends thereof, and the handle oblique bosses 15 matches with the spring strip oblique bosses 11. A position-limiting convex portion 16 is fixed at a middle position of the handle 2, and a size and a position of the position-limiting convex portion 16 match with the position-limiting holes 12.

During the process of using the tool-free hard disk mounting and dismounting device according to the present application, when the hard disk is being fixed, the screw holes at one side of the hard disk are matched with the fixing convex portions 8 at the two sides of the first vertical plate 4, and the fixing convex portions 8 are engaged in the screw holes at the one side of the hard disk; the fixing columns 10 at the bent portions 9 at the two ends of the spring strip 1 are engaged into the fixing holes respectively at another side of the hard disk, and the supporting bosses 7 support the hard disk to prevent the PCB at the bottom of the hard disk from coming into direct contact with the fixing support, thus the hard disk is entirely fixed on the fixing support.

When the hard disk is being dismounted, the flat head screws 14 are loosened and then the handle 2 is moved along the slide slots 13. At this time, a height of a contact portion between each of the spring strip oblique bosses 11 and the corresponding handle oblique boss 15 is gradually increased, such that the left and right sides of the spring strip 1 are lifted. When the position-limiting convex portion 16 slides from one position-limiting hole 12 into the other position-limiting hole 12 in the middle of the spring strip 1, the two ends of the spring strip 1 are lifted up by a fixed height, such that the fixing columns 10 are disengaged from the fixing holes at the another side of the hard disk, thus achieving the unlocking of the hard disk, and the hard disk is easily dismounted.

The embodiments described above are only preferred embodiments of the present application, and all of the usual changes and substitutions made by those skilled in the art within the scope of the technical solution of the present application should be covered in the scope of protection of the present application.

The invention claimed is:

1. A tool-free hard disk mounting and dismounting device, comprising:
   a fixing support;
   a spring strip; and
   a handle;
   wherein the fixing support comprises a base plate, a first vertical plate and a second vertical plate, the first vertical plate and the second vertical plate are fixed to two sides of the base plate respectively, and fixing convex portions are provided at two sides of the first vertical plate respectively;
   the spring strip is fixed to the second vertical plate and located at an outer side of the second vertical plate, a bent portion is provided at each of two ends of the spring strip, a fixing column is provided at each of the bent portions, and a spring strip oblique boss is provided at each of two sides of the spring strip;
   the handle is arranged at an inner side of the second vertical plate, a slide slot is provided at each of two sides of the handle, the handle is in slide fit with the second vertical plate through the slide slots, the handle is provided with a handle oblique boss at each of two ends thereof, and the handle oblique bosses cooperate with the spring strip oblique bosses; and
   a first connection structure is provided at a middle position of the spring strip, a second connection structure is provided at a middle position of the handle, and the spring strip cooperates with the handle through the first connection structure and the second connection structure.

2. The tool-free hard disk mounting and dismounting device according to claim 1, wherein the base plate is provided with supporting bosses at four opposite corners thereof respectively.

3. The tool-free hard disk mounting and dismounting device according to claim 2, wherein a hollowed out portion is formed at a bottom of the base plate.

4. The tool-free hard disk mounting and dismounting device according to claim 3, wherein the first connection structure is a plurality of position-limiting holes, and the second connection structure is a position-limiting convex portion.

5. The tool-free hard disk mounting and dismounting device according to claim 4, wherein the first vertical plate and the second vertical plate are fixed at edges of the two side of the base plate respectively.

6. The tool-free hard disk mounting and dismounting device according to claim 5, wherein the first vertical plate and the second vertical plate are detachably fixed to the base plate.

7. The tool-free hard disk mounting and dismounting device according to claim 6, wherein the first vertical plate is in parallel with the second vertical plate.

8. The tool-free hard disk mounting and dismounting device according to claim 1, wherein a hollowed out portion is formed at a bottom of the base plate.

9. The tool-free hard disk mounting and dismounting device according to claim 8, wherein the first connection structure is a plurality of position-limiting holes, and the second connection structure is a position-limiting convex portion.

10. The tool-free hard disk mounting and dismounting device according to claim 9, wherein the first vertical plate and the second vertical plate are fixed at edges of the two side of the base plate respectively.

11. The tool-free hard disk mounting and dismounting device according to claim 10, wherein the first vertical plate and the second vertical plate are detachably fixed to the base plate.

12. The tool-free hard disk mounting and dismounting device according to claim 11, wherein the first vertical plate is in parallel with the second vertical plate.

* * * * *